United States Patent
Zhang et al.

[11] Patent Number: 5,901,453
[45] Date of Patent: May 11, 1999

[54] GRADIOMETER

[75] Inventors: Yi Zhang; Walter Wolf, both of Jülich; Herbert Bousack, Aachen; Helmut Soltner, Inden, all of Germany

[73] Assignee: Forschungszentrum Julich GmbH, Julich, Germany

[21] Appl. No.: 08/860,986

[22] PCT Filed: Dec. 14, 1995

[86] PCT No.: PCT/DE95/01816

§ 371 Date: Jun. 16, 1997

§ 102(e) Date: Jun. 16, 1997

[87] PCT Pub. No.: WO96/19736

PCT Pub. Date: Jun. 27, 1996

[30] Foreign Application Priority Data

Dec. 21, 1994 [DE] Germany ............................. 44 45 700

[51] Int. Cl.$^6$ ................................................ G01R 33/02
[52] U.S. Cl. .............................. 33/366; 324/248; 505/846
[58] Field of Search .................... 33/316, 317, 317 D, 33/356, 357, 361, 365, 366; 324/248; 505/845, 846

[56] References Cited

U.S. PATENT DOCUMENTS

| | | | |
|---|---|---|---|
| 4,613,816 | 9/1986 | Zeamer | 33/367 |
| 4,761,611 | 8/1988 | Hoenig | 324/248 |
| 4,767,988 | 8/1988 | Willson | 33/355 R |
| 4,771,239 | 9/1988 | Hoenig | 324/248 |
| 5,053,834 | 10/1991 | Simmonds | 324/248 |
| 5,218,297 | 6/1993 | Nakane et al. | 324/248 |
| 5,252,921 | 10/1993 | Nakane | 324/248 |
| 5,465,049 | 11/1995 | Matsuura et al. | 324/248 |
| 5,625,290 | 4/1997 | You | 324/248 |
| 5,672,967 | 9/1997 | Jensen et al. | 33/361 |

FOREIGN PATENT DOCUMENTS

| | | |
|---|---|---|
| 0 501 220 A2 | 9/1992 | European Pat. Off. . |
| 0 567 386 A2 | 10/1993 | European Pat. Off. . |
| 39 11 195 C2 | 3/1993 | Germany . |
| WO 90/00742 | 1/1990 | WIPO . |

OTHER PUBLICATIONS

SQUID with Integral Flux Concentrator, published 2301 NTIS Tech Notes (1990) Mar.
Multi–Channel High Tc SQUID, published 2334c IEICE Transactions on Electronics, E&&–C(1994)Aug., No. 8.
A Second–Order SQUID Gradiometer Operating at 77 K, published Supercond. Sci. Technol. 7 (1994) 266–268.
High Sensitive Magnetometers and Gradiometers Based on DC SQUIDS with Flux Focuser, published IEEE Transactions on Magnetics. vol. 27, No. 2, Mar. 1991.
Design of Improved Integrated Thin–Film Planar dc SQUID Gradiometers, published J. Appl. Phys. 58 (11), Dec. 1, 1985.
Bulk BiPbSrCacuO rf SQUIDS oeprating up to 101 K, published Appl. Phys. Lett. 56 (16), Apr. 16, 1990.
Low–noise $Yba_2Cu_3O_7$ rf SQUID magnetometer, published Appl. Phys. Lett. 60(5), Feb. 3, 1992.

*Primary Examiner*—G. Bradley Bennett
*Attorney, Agent, or Firm*—Herbert Dubno

[57] ABSTRACT

A gradiometer for measuring magnetic field gradients has two SQUID loops lying in a SQUID loop plane with a flux concentrator lying in a flux concentrator plane parallel to the SQUID loop plane. The flux concentrator body is mirror symmetrical with respect to a plane of symmetry perpendicular to the SQUID plane and the flux concentrator plane along a basis line connecting the centers of the SQUID loops.

9 Claims, 10 Drawing Sheets

GRADIOMETER

CROSS REFERENCE TO RELATED APPLICATIONS

This application is a national stage of PCT/DE 95/01816 filed Dec. 14, 1995 and based upon German national application P44 45 700.6 on Dec. 21, 1994 under the International Convention.

FIELD OF THE INVENTION

The invention relates to a gradiometer with two SQUIDs each containing a SQUID loop.

For the quantitative investigation of magnetic fields or magnetic field gradients, especially in the field of nondestructive testing of workpieces or in the field of biomagnetic investigations with the aid of SQUID, a gradiometer which can suppress detrimental fields is highly desirable. The detrimental effects include fluctuations of the field of the earth as well as fields which are synthetic and electromagnetically load the environment, for example like the 50 Hz alternating current field emanating from electrical apparatus. On the basis of low $T_c$ materials, gradiometers are already known which can be produced at relatively low cost. For these purposes ductile wires are used with the aid of which closed coil pairs with partly opposing winding directions enables elimination of fields with low gradients. In the field of high $T_c$ materials, up to now no suitable wires have been provided.

From Supercond. Sci. Technol. 7 (1994), 265–268, so-called axial gradiometers are known in which two SQUIDs are arranged in planes spaced from one another up to several centimeters. Here the signals of the individual SQUIDs can be processed in separate electronic systems and subtracted from one another.

These gradiometers have the drawback of a high fabrication cost and, associated with it, the need for expensive mechanical alignments. In addition, in the case of such a gradiometer with two SQUIDS, gradient signals are suppressed only with the aid of a further, third SQUID, forming in this manner a second order gradiometer.

A gradiometer is known further from Appl. Phys. Lett. 56 (1990 1579 in which the Josephson junction lies symmetrically between two relatively widely-spaced SQUID loops and is connected with them through thin slits. Such a gradiometer has the drawback that one is limited to a relatively short base length (spacing of the middles of the respective SQUID loops from one another), since otherwise the SQUID inductivity is too large and as a result the SQUID signal is too small.

OBJECT OF THE INVENTION

It is thus the object of the invention to provide a gradiometer which is of a comparatively simple type and which is free from the drawbacks of the known gradiometers and which can achieve increased measurement precision of the magnetic field or the magnetic field gradient.

SUMMARY OF THE INVENTION

The gradiometer of the invention contains SQUIDS so arranged with respect to one another that the SQUID loops are spaced apart by a basis length $L_1$ and lie in a plane. A flat flux concentrator is parallel to this plane and encompasses both SQUID loops, the flux concentrator being mirror symmetrical on either side of a basis line $B_1$ connecting the centers of the two SQUID loops with each other.

A gradiometer according to the invention is provided with the SQUIDs so juxtaposed with one another that the SQUID loops are spaced by a basis length $L_1$ from one another in a plane and a flat flux concentrator encompasses both SQUID loops parallel to this plane. Here the flux concentrator is formed laterally and mirror symmetrically with respect to the basis line connecting the centers of the two SQUID loops.

It has been found that upon the application of a homogeneous magnetic field perpendicular to the gradiometer plane, shielding currents are induced at the outer edge of the flux concentrator and which generate concentrated magnetic fields of equal size at each of the locations of the SQUIDs. By subtraction of the respective signals of the individual SQUIDS, different signals are obtained which in such a gradiometer are free from spatially homogeneous spurious signals. Inhomogeneous fields however are concentrated to different degrees in the individual SQUIDs and form in this case a difference signal differing from zero.

The gradiometer of the invention has the special advantage that a given desired basis length of the gradiometer can be selected by suitable constructive features without leading to an increase in the inductivity and thus a reduction associated therewith of the signal of the gradiometer.

In an especially advantageous embodiment of the gradiometer, it is provided that the flux concentrator have an electrically insulating layer connecting both parts in the mirror symmetry plane perpendicular to its surface. Thus the shielding currents at edges of the respective flux concentrator parts pass the SQUID loops and generate at the regions of the SQUIDs concentrated magnetic fields of equal magnitudes.

In an especially advantageous way, at least a further SQUID is provided which lies in the plane of both first SQUIDs, whereby the flux concentrator is so formed thereon that it also encompasses or surrounds even this SQUID. In this way one can obtain a gradiometer with multiple different spatial orientations and base lengths, each of which represents a respective gradiometer.

Especially advantageous is a gradiometer which has at least one pair of SQUIDs which are provided in the plane of the two first SQUIDs, whereby this pair of SQUIDs has a base line which is not parallel to the base line of the first two SQUIDs but is preferably perpendicular thereto. In this case, one obtains a planar gradiometer that is suitable for determining magnetic fields or magnetic field gradients in two independent spatial orientations.

It is advantageous for alignment of the SQUIDs of the gradiometer to provide an alignment plate which is comprised of superconductive material and is arranged parallel to the plane of the flux concentrator and shiftable relatively thereto. In an advantageous manner, the flux concentrator is arranged in the region of the base line so as to be shiftable. It is possible to provide as the alignment plate an additional magnetometer SQUID. In this case an active alignment is achievable.

An especially advantageous embodiment of the gradiometer is obtained when the material for forming the flux concentrator and/or as the material for the alignment plate is a high temperature superconductor (HTSC) Advantageous characteristics associated with such a material are fully translatable to such a gradiometer, especially as to use in association with liquid nitrogen. When the gradiometer has at least one washer SQUID as is known for example from Appl. Phys. Lett. 60 (1992) 645 or, indeed, is composed exclusively of washer SQUIDs, preferably as HTSC washer SQUIDs, it is especially advantageous to fabricate the gradiometer utilizing thin film techniques. Thus the flux concentrator can be an HTSC thin film applied to a substrate.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
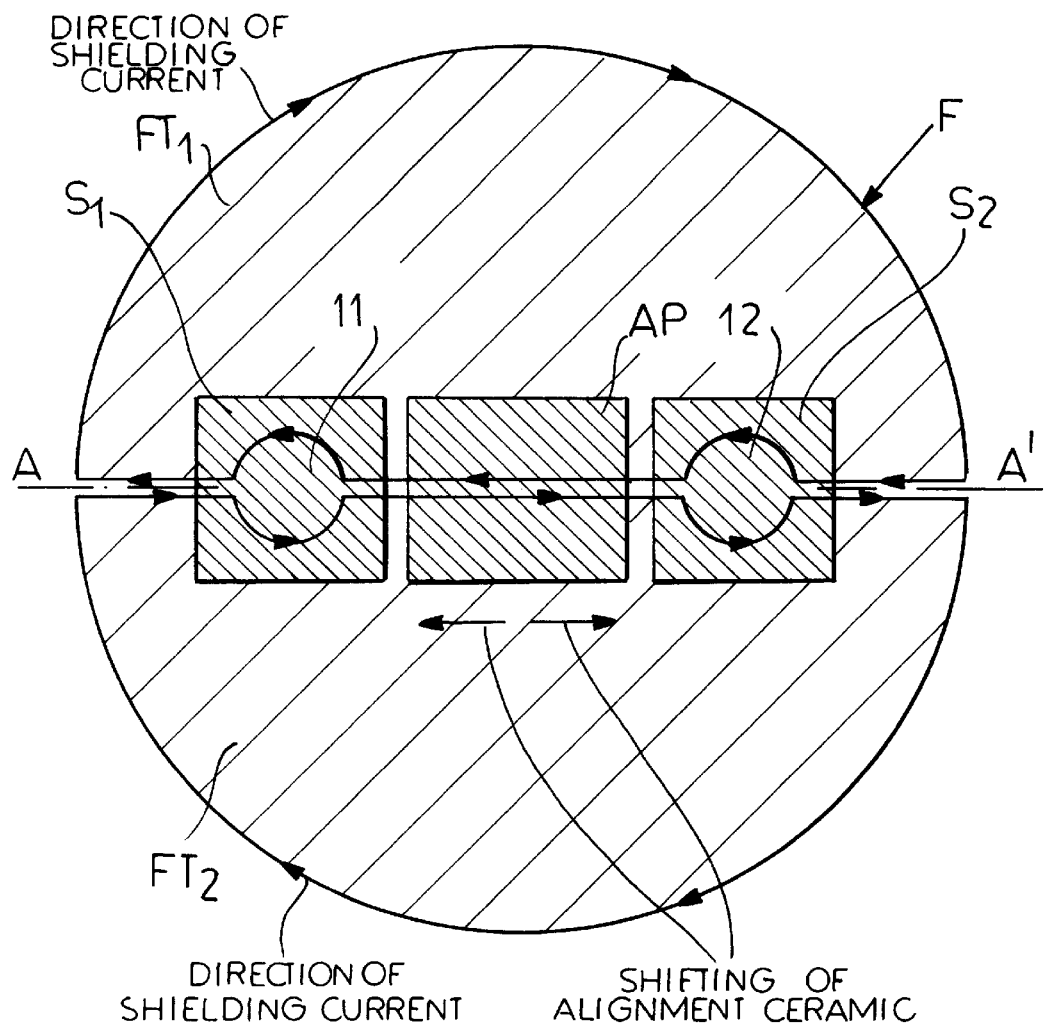
FIG. 1 is a plan view of a gradiometer according to the invention.
Figure 2:
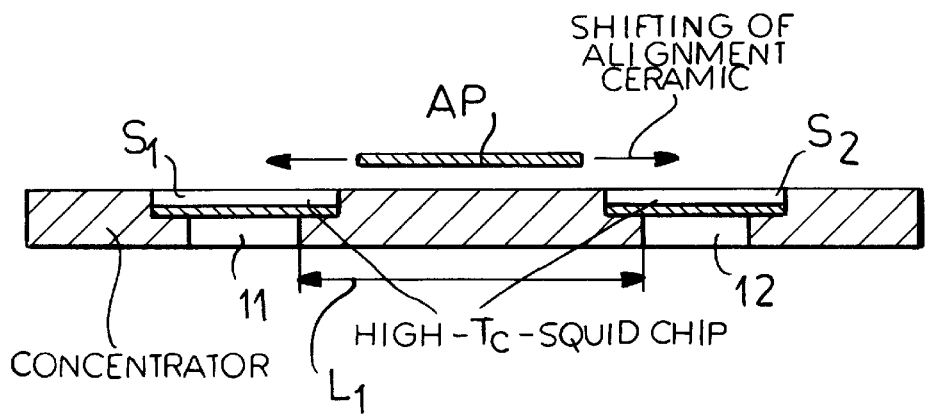
FIG. 2 is a section taken along the line A–A' of FIG. 1.

In FIG. 1 a gradiometer with a massive circular-disk-shaped concentrator is shown in plan view FIG. 2 is a cross-section along the line AA'.

This concentrator of HTSC material is produced process-wise as follows:

from a massive piece of HTSC, here $YBa_2Cu_3O_7$, a circular disk shape is cut; this is subdivided into two equal size semicircular parts, both of which are provided with semicircular disk-shaped openings on the separation line A' at a distance of the basis length $L_1$ from one another. Finally, both parts are joined together with the aid of electrically insulating cement to form the concentrator 7 as a circular shape with two circular disk-shaped openings 11 and 12 at a spacing $L_1$.

In detail, FIG. 1 shows the two semicircular disk-shaped parts $FT_1$ and $FT_2$ with circular disk-shaped openings 11 and 12 at a spacing $L_1$. The openings 11 and 12 are, in this special case, so formed that they can receive two square-shaped washer SQUIDs $S_1$ and $S_2$ in corresponding recesses on the upper side of the concentrator F. For alignment, a shiftable alignment plate AP of HTSC is provided in the region between the positions of both SQUIDs $S_1$ and $S_2$. The plate AP in this special case is rectangular although other shapes can be chosen as well.

The superconducting shielding current in the concentrator F which forms at the use temperature are represented in FIG. 1 in the form of loops provided with arrows. The currents form at the edges of the respective semicircular disk-shaped parts $FT_1$ and $FT_2$ and one obtains in this manner opposite current directions at the openings 11 and 12 and in the two parts $FT_1$ and $FT_2$ and a ring current at the openings 11, 12 which in this case of the positioning of the SQUIDs $S_1$ and $S_2$ in the respective recesses in concentrator F effects a flux focussing of the magnetic field in the SQUID loops of the respective SQUIDs.

The massive concentrator F has a diameter of 50 mm with a circular disk thickness of 3 mm. The openings 11 or 12 are each of a diameter of 6 mm. The basis length $L_1$ is in this case selected to be 30 mm. The rectangular substrates $S_1$ and $S_2$ containing the respective washer SQUIDs are 10×10 mm$^2$ and the recesses for them are only slightly larger.

By selection of another geometry of the parts, the gradiometer can have greater or lesser basis lengths with corresponding gradiometer characteristics.

Figure 3:
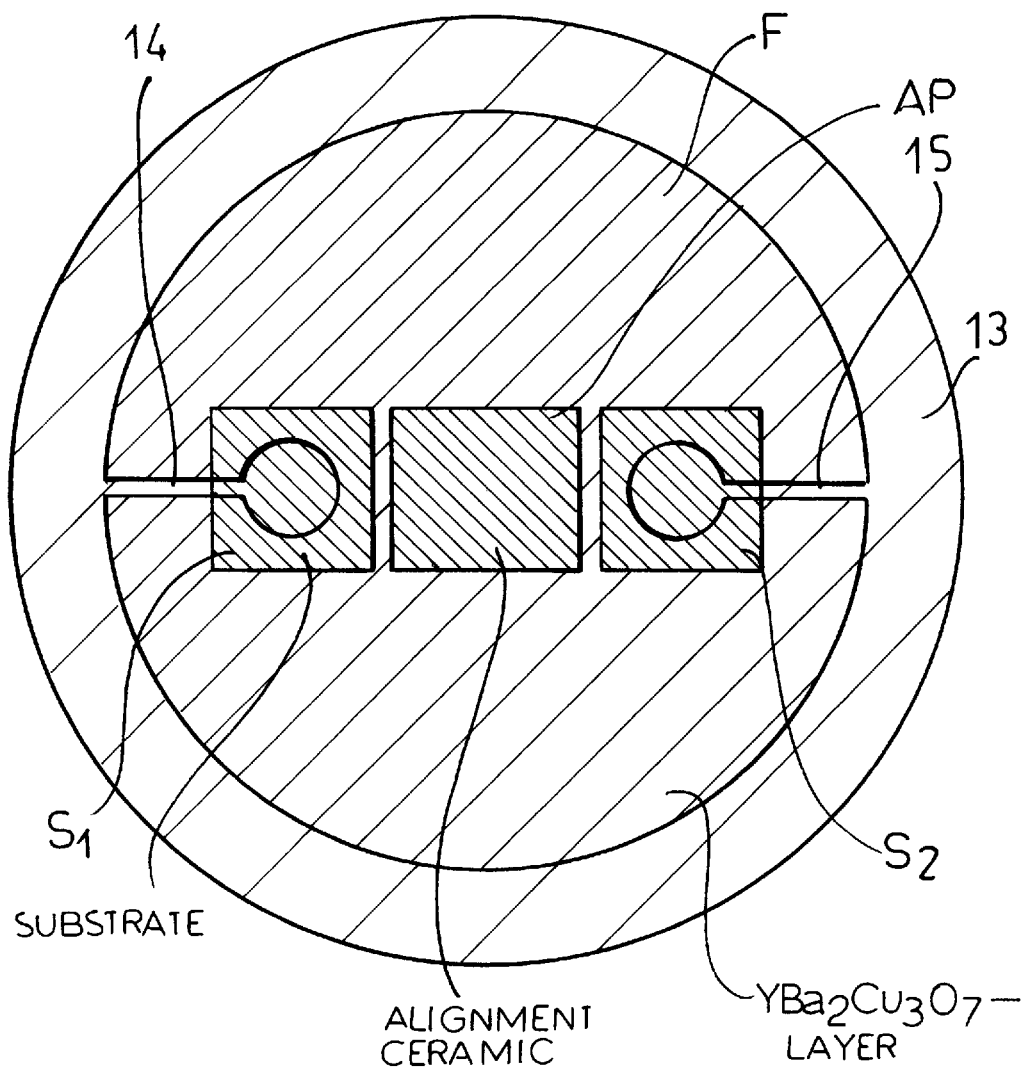
FIG. 3 is a view similar to FIG. 1 of another embodiment of a gradiometer.
Figure 4:
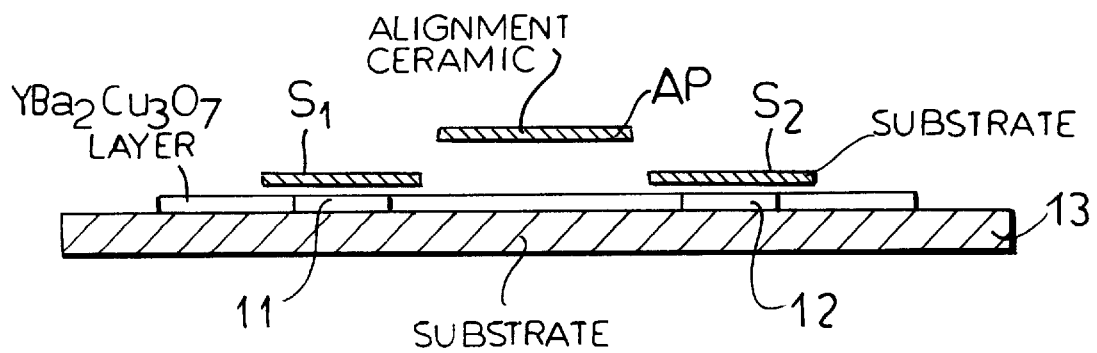
FIG. 4 is a section through this other embodiment analogous to FIG. 2.
Figure 5:
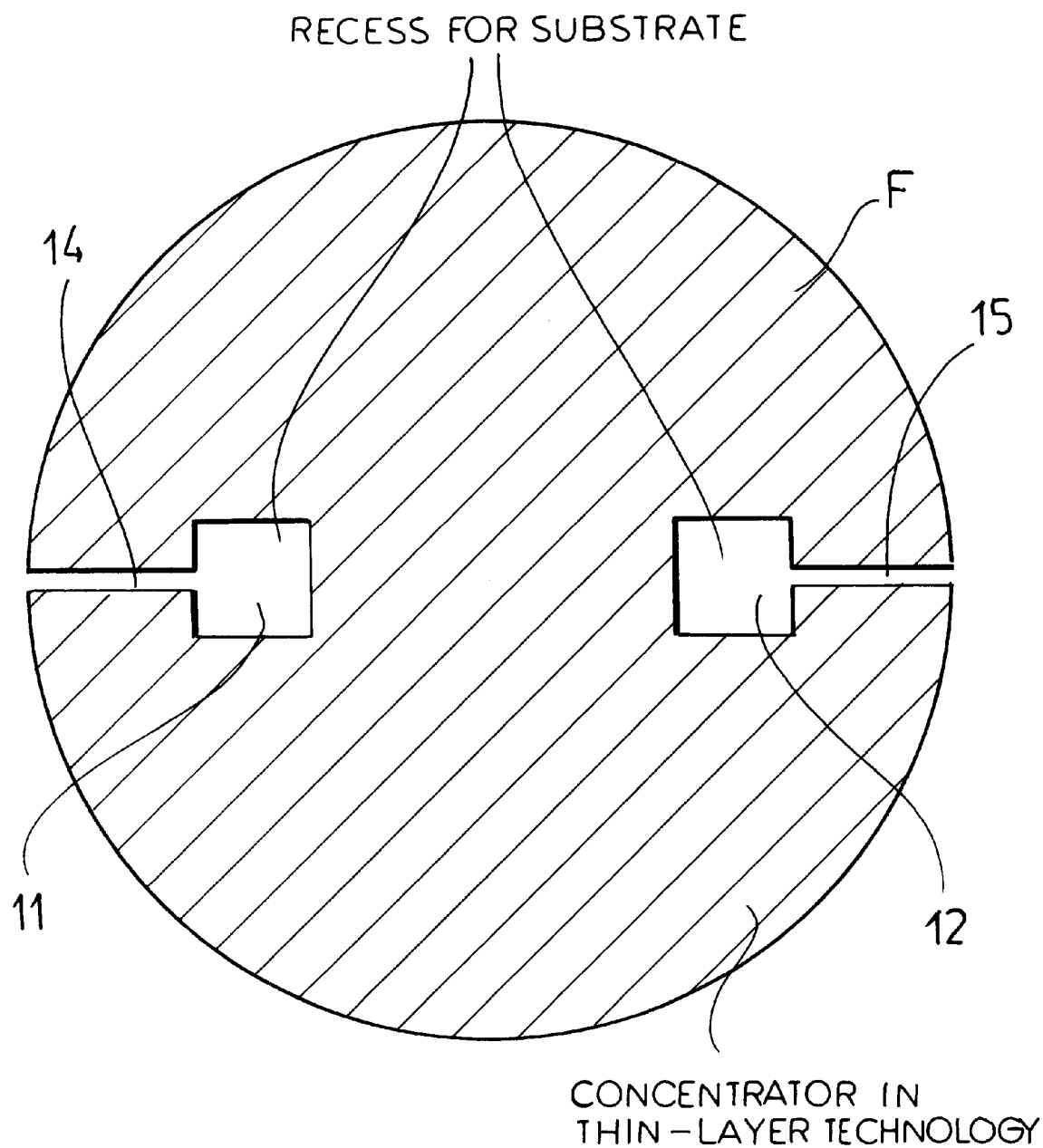
FIG. 5 is a plan view of another two SQUID embodiments.

In FIGS. 3 and 4 a gradiometer is schematically shown which has a flux concentrator F fabricated in thin layer technology. On a circular substrate 13 using known masking techniques, a circular $Yba_2Cu_3O_7$ layer is formed which is provided with two openings 11 or 12 and respectively with an HTSC free rib 14 or 15 extending to the edge of the circular layer F. In this manner, during use, shielding currents form at the edges of this thin film flux concentrator F which are comparable with the currents in the gradiometer according to FIGS. 1 and 2 and with comparable ring currents at the respective openings 11 and 12 (diameter equal 6 mm). The circular layer F has a diameter of 48 mm and the width of the ribs 14 and 15 amounts to 6 $\mu$m while its length is about 10 mm. FIG. 5 shows the lateral configuration of the thin layer concentrator of the gradiometer shown in FIG. 2. A variant of this gradiometer with a thin film concentrator F can have, instead of two SQUID recesses (11, 12), four SQUID recesses 11, 12, 16 and 17 which has been schematically illustrated in FIG. 6 for a corresponding flux concentrator fabricated in accordance with thin film technology in plan view. Thus one obtains a gradiometer which enables, with the aid of four SQUIDs in two laterally independent orientations, determination of a picked-up magnetic field or magnetic field gradient.

Figure 7:
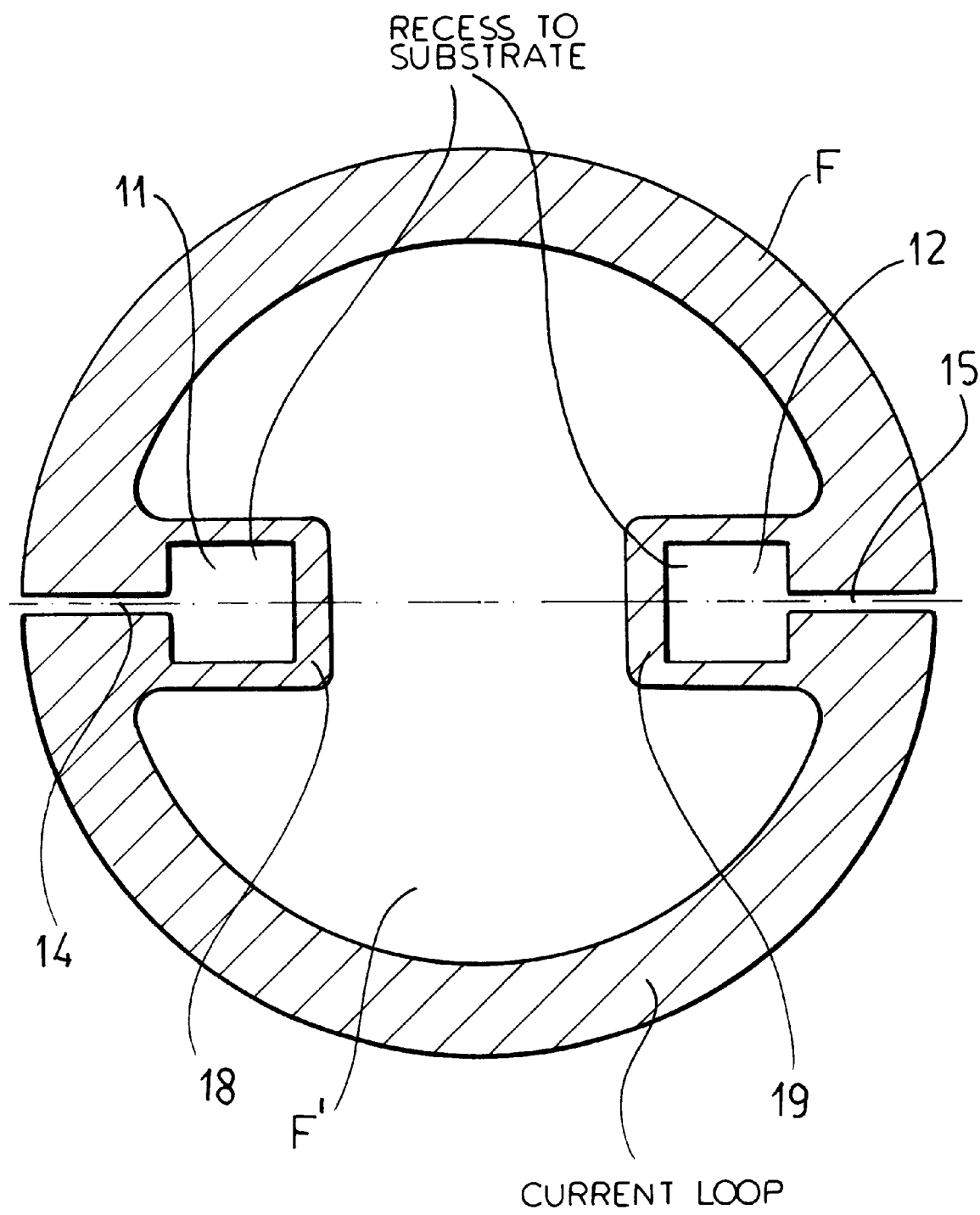
FIG. 7 is a plan view of an embodiment in which the high temperature superconductor is in the form of a ring.

The concentrator should be so formed with the ring currents are forced to flow at the edges of the respective openings (11, 12, 16 17) for the respective SQUIDS. A further variant of the concentrator has a lateral layer structuring as shown by hatching in FIG. 7.

Figure 6:
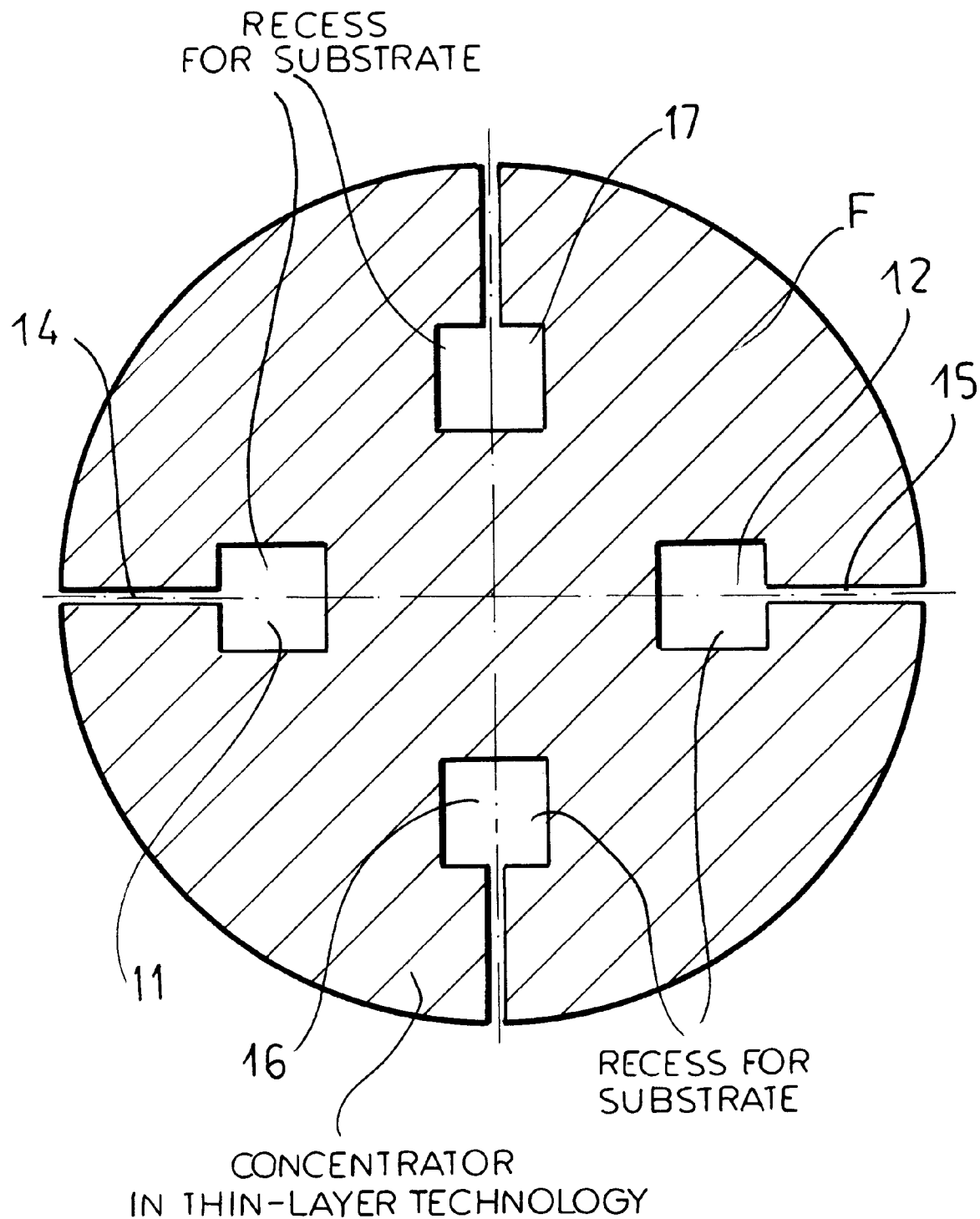
FIG. 6 is a plan view of a four SQUID embodiment.
Figure 8:
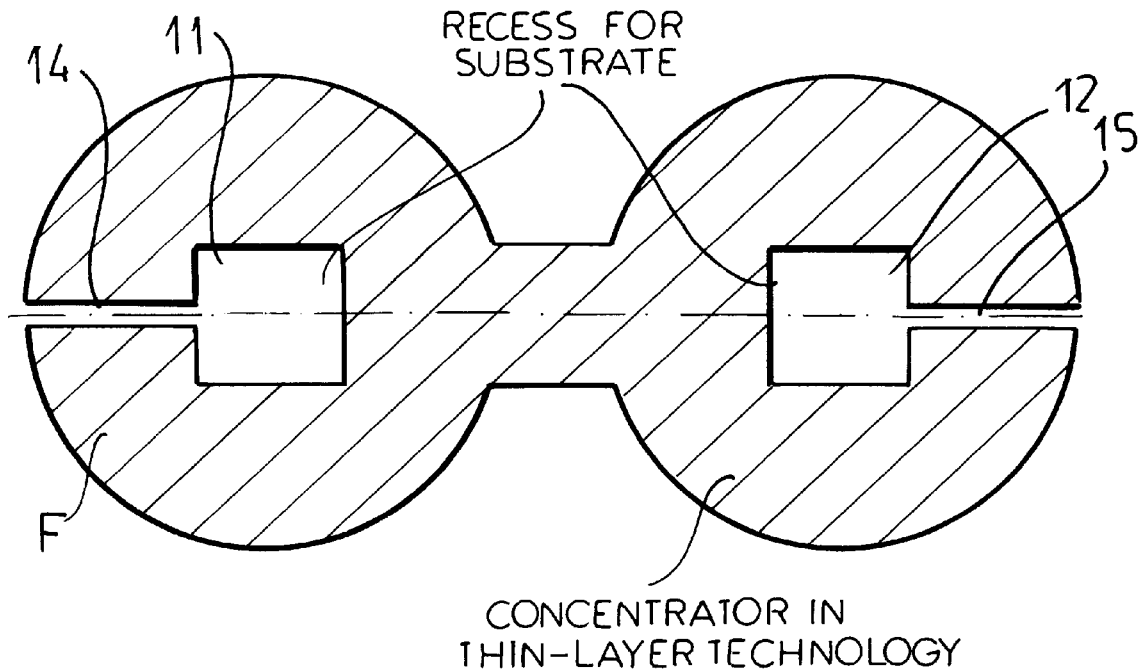
FIGS. 8–14 are plan views of still other embodiments of the gradiometer.
Figure 9:
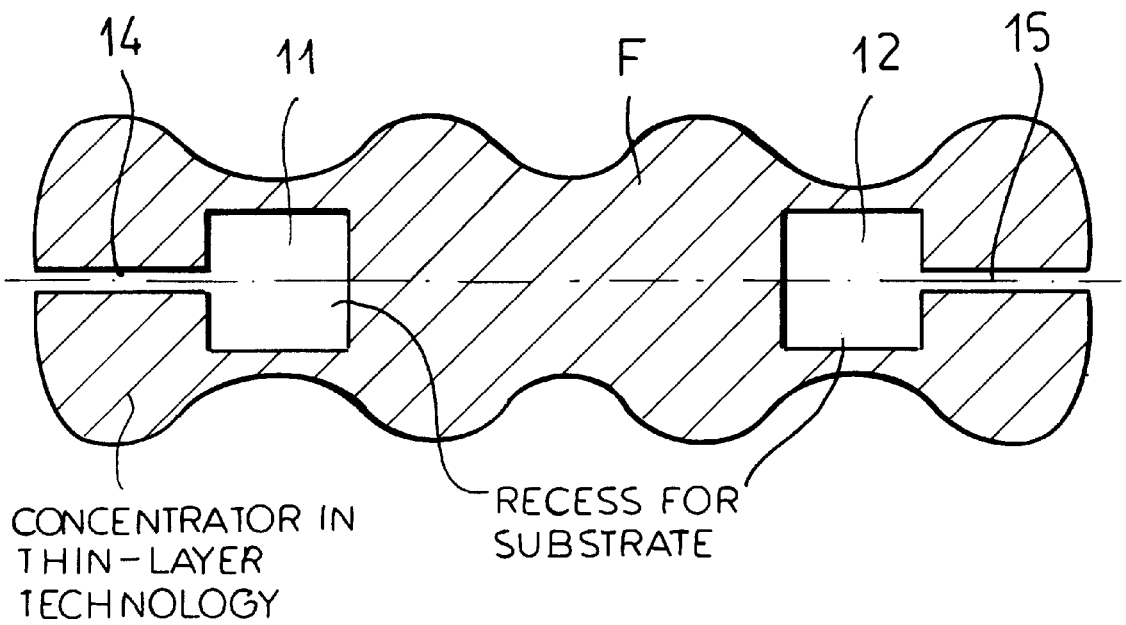
Figure 10:
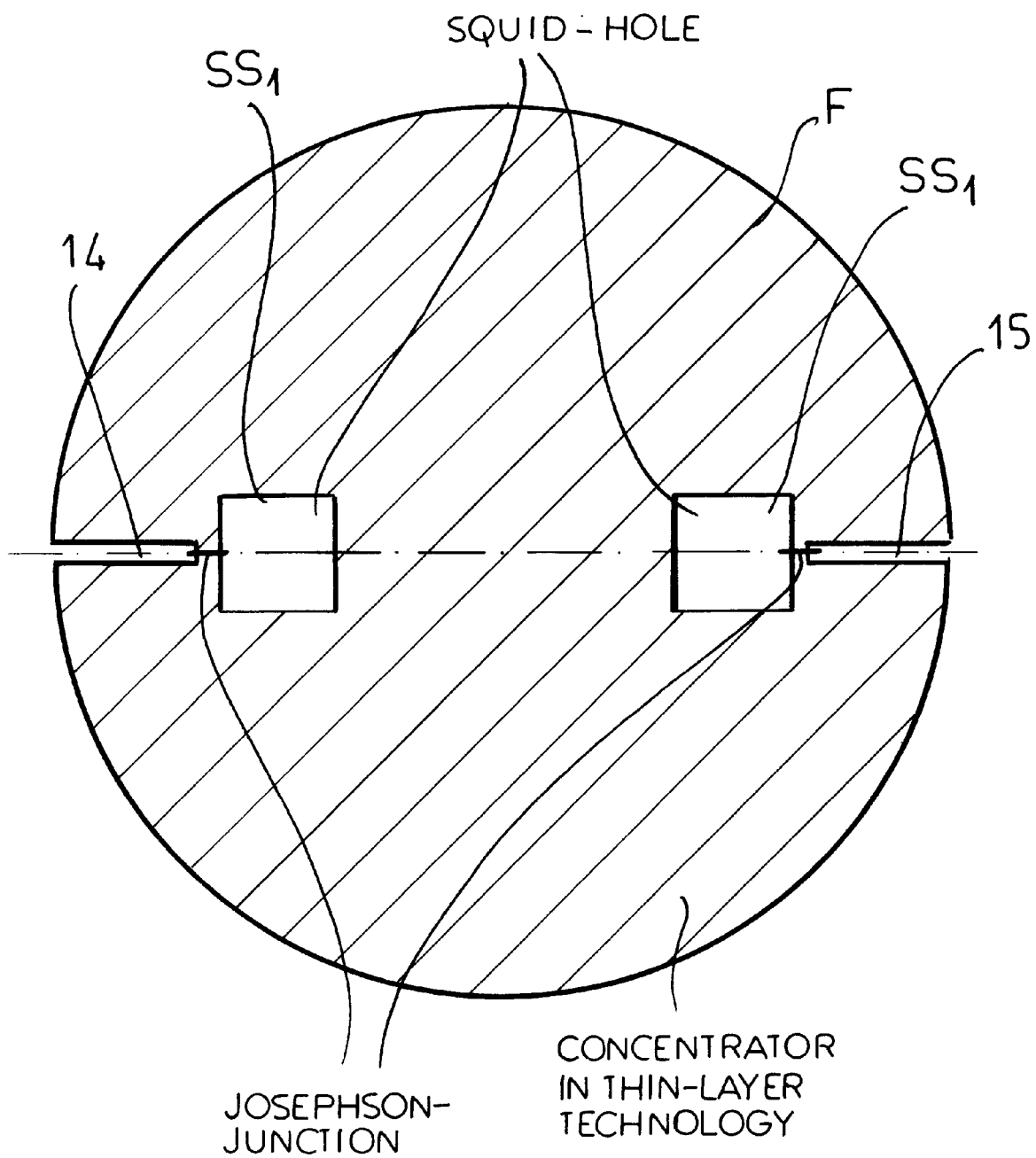

By contrast to the layer structure of the concentrator of FIG. 6, HTSC material at the central region F' of the circular layer F is largely eliminated. The HTSC webs 18 and 19 which surround respective inwardly lying openings 11 and 12 in FIG. 5 have a width of only about 3 mm. A circular edge configuration of the concentrator F can be formed either by thin film technology or as a massive structure. It can also have other shapes deviating from that shown. Thus in FIGS. 8 and 9, further lateral configurations of a suitable concentrator in thin film technology for the gradiometer have been illustrated.

In FIGS. 10–14, not only the concentrator F but also the respective SQUID functions $SS_1$, . . . have been integrated in thin film technology. It should be noted in this connection that the openings indicated here serve for the function of flux focussing 11, 12, 16, 17 and also simultaneously the SQUID function $SS_1$ . . . . The respective small connecting strips between the respective rectangular openings and the ribs 14, 15, 20, 21 connecting them with the edge of the concentrator provide Josephson junctions as has been schematically illustrated. Geometrically by comparison to the previous FIGS. 1–9 where openings 11, 12, 16, 17 or $SS_1$ . . . are also about 10×10 mm$^2$ in size, the openings 11, 12, 16, 17 or $SS_1$, . . . in FIGS. 10–14 for forming the SQUID function $SS_1$, . . . are only 200×200 $\mu$m$^2$ in size have also been fabricated.

Figure 11:
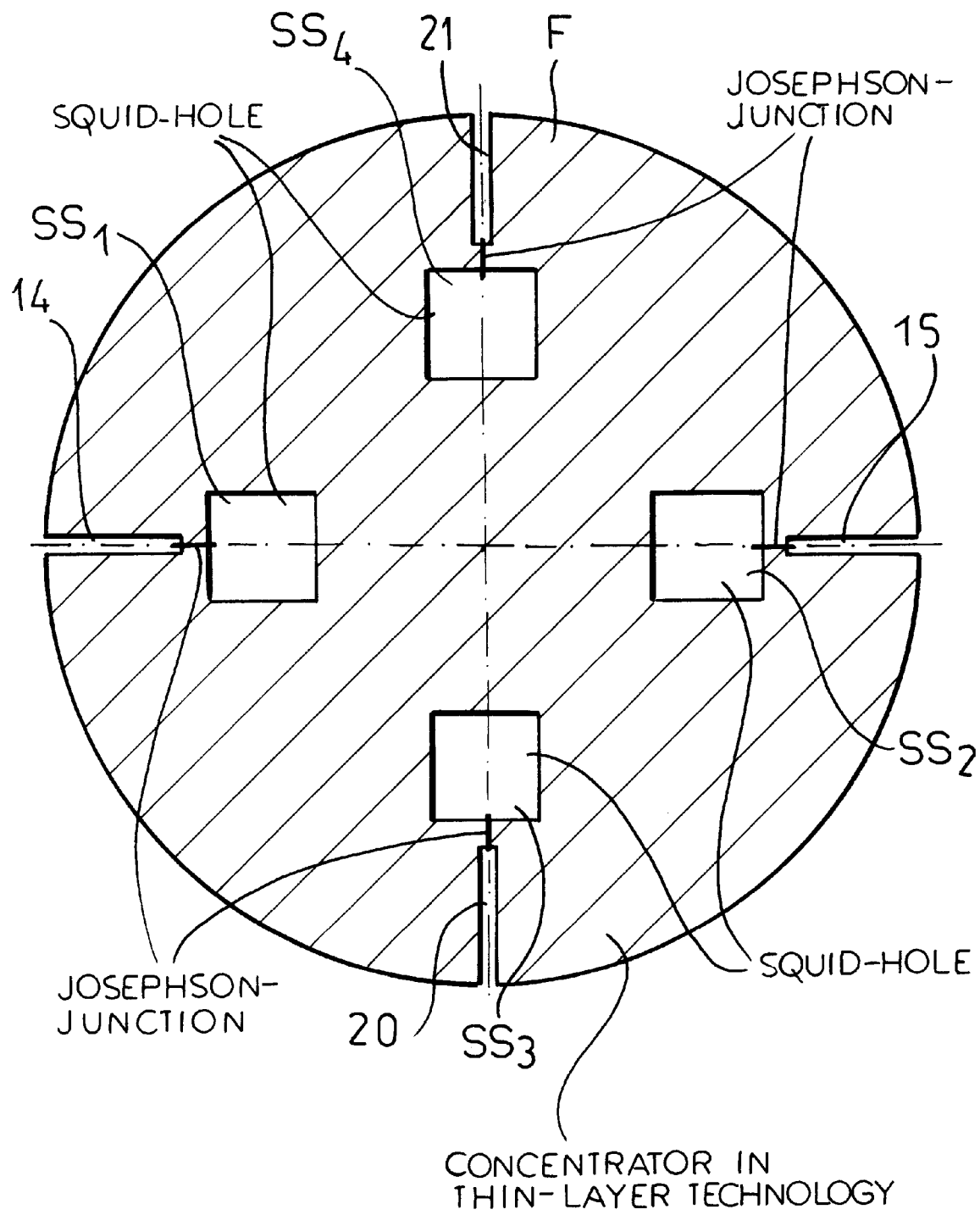

In FIG. 11 a gradiometer is shown in plan view as fabricated by thin film technology with a circular concentrator and 4 SQUID functions $SS_1$, $SS_2$, $SS_3$ and $SS_4$ integrated therein.

Figure 12:
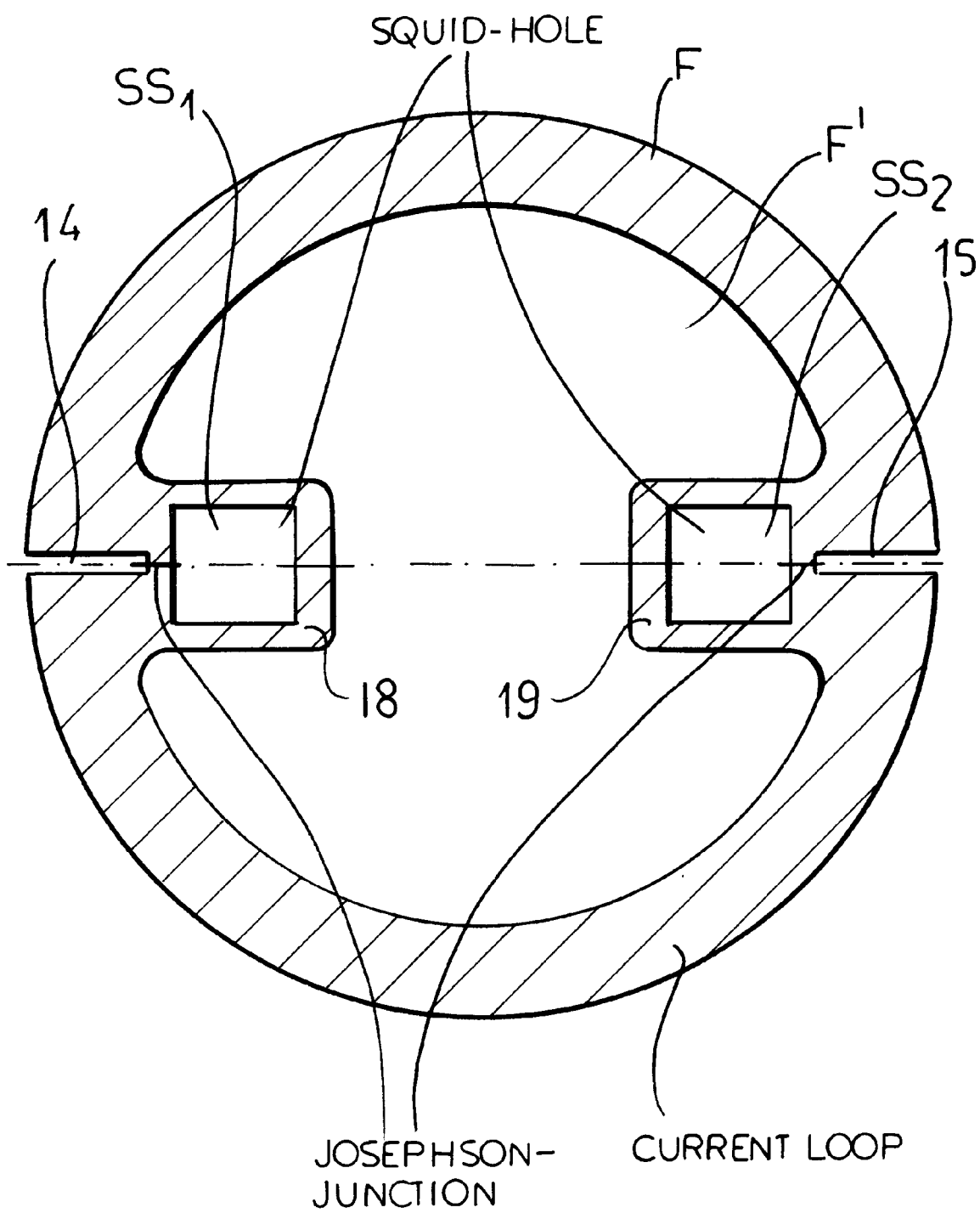
Figure 13:
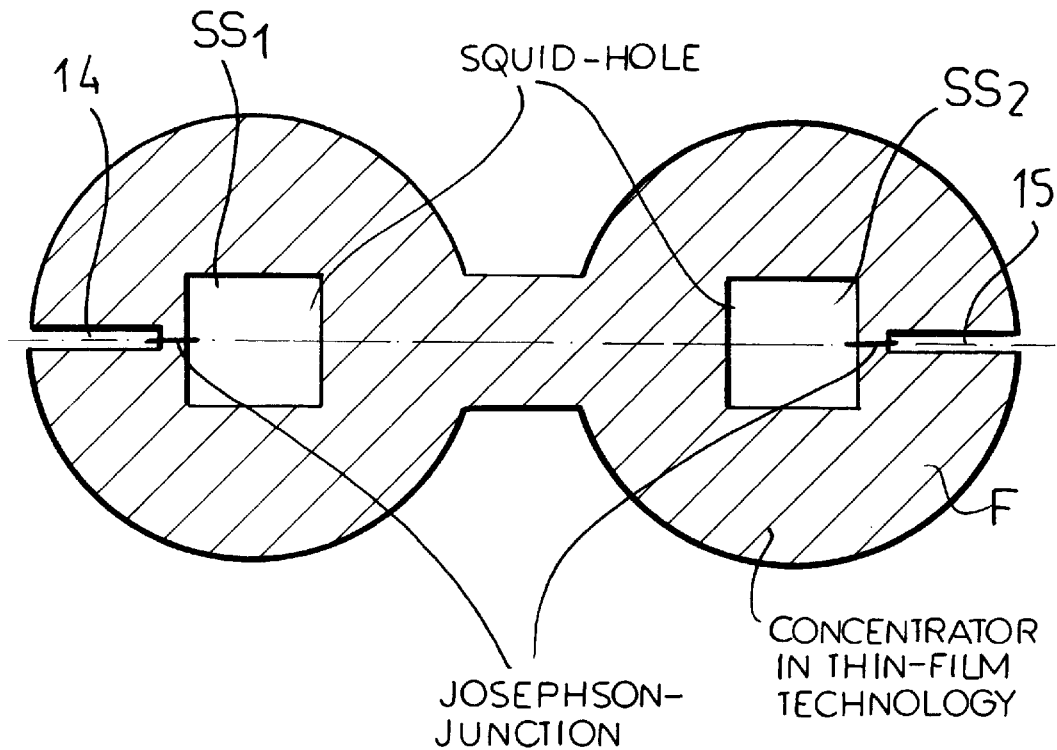
Figure 14:
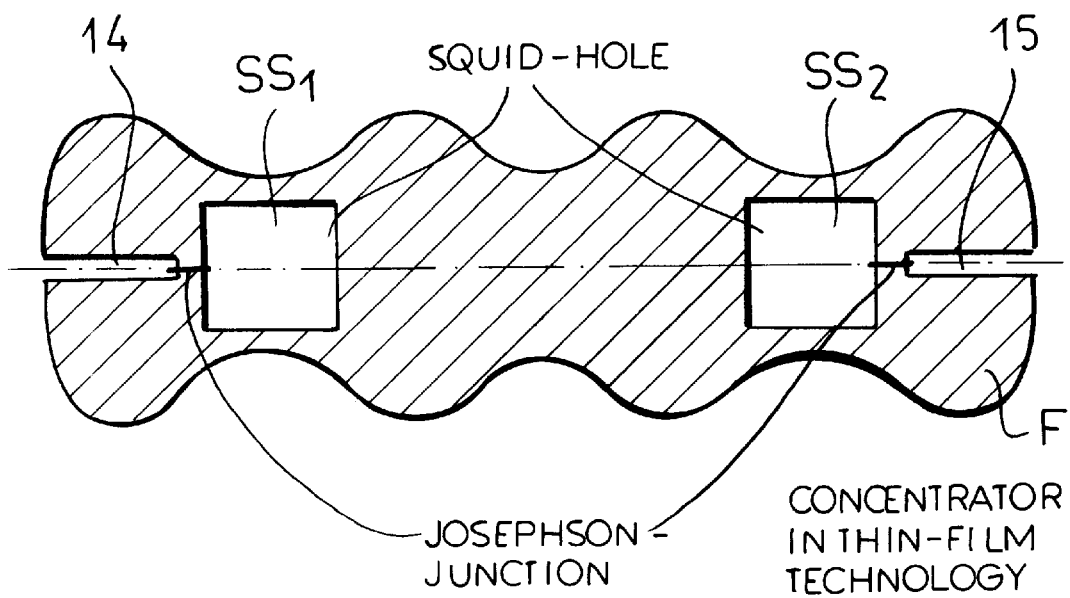

FIG. 12 shows a variant of the gradiometer with two SQUID functions $SS_1$ and $SS_2$ integrated in a thin layer concentrator F. Two further variants deviating from the circular configuration for forming gradiometers with integrated SQUID functions $SS_1$ and $SS_2$ in the concentrator have been shown finally in FIGS. 13 and 14. The embodiments here illustrated of the gradiometer represent only possible configurations of the invention by way of example. Geometrically many further combinations of the individual elements of the here-described gradiometer variants can be conceived of depending upon desired or predetermined boundary conditions.

We claim:

1. A gradiometer for measuring magnetic field gradients, comprising:

two SQUID loops lying in a SQUID-loop plane and spaced apart by a basis length in said plane; and a flat flux concentrator body lying in a flux-concentrator plane parallel to said SQUID-loop plane, closely juxtaposed with said SQUID loops and having a perimeter lying outwardly of said SQUID loops, said flux concentrator body being mirror symmetrical with respect to a plane of symmetry perpendicular to said SQUID-loop plane and said flux-concentrator plane and lying along a basis line connecting centers of said SQUID loops.

2. The gradiometer defined in claim 1 wherein said flux-concentrator body is subdivided into two halves along said line and the two halves are insulated electrically from one another along said line.

3. The gradiometer defined in claim 1, further comprising at least one further SQUID lying in said SQUID plane and within said perimeter.

4. The gradiometer defined in claim 1, further comprising a pair of further spaced-apart SQUIDs lying along another basis line perpendicular to the first-mentioned basis line in said SQUID plane and within said perimeter.

5. The gradiometer defined in claim 1, further comprising an alignment plate parallel to said SQUID plane and to said flux-concentrator plane and shiftable on said flux-concentrator body.

6. The gradiometer defined in claim 5 wherein said alignment plate is composed of a high temperature superconductor.

7. The gradiometer defined in claim 6 wherein said body has at least a layer of a high temperature superconductor thereon.

8. The gradiometer defined in claim 1 wherein said body has at least a layer of a high temperature superconductor thereon.

9. The gradiometer defined in claim 1 wherein said SQUIDs are washer SQUIDs.

* * * * *